(12) United States Patent
Acconcia

(10) Patent No.: US 10,578,646 B2
(45) Date of Patent: Mar. 3, 2020

(54) TESTING HEAD COMPRISING VERTICAL PROBES WITH INTERNAL OPENINGS

(71) Applicant: TECHNOPROBE S.p.A., Cernusco Lombardone (IT)

(72) Inventor: Daniele Acconcia, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 75 days.

(21) Appl. No.: 15/703,627

(22) Filed: Sep. 13, 2017

(65) Prior Publication Data

US 2018/0011126 A1 Jan. 11, 2018

Related U.S. Application Data

(63) Continuation-in-part of application No. PCT/EP2016/055141, filed on Mar. 10, 2016.

(30) Foreign Application Priority Data

Mar. 13, 2015 (IT) .............................. MI2015A0386

(51) Int. Cl.
*G01R 31/20* (2006.01)
*G01R 1/067* (2006.01)
*G01R 1/073* (2006.01)

(52) U.S. Cl.
CPC ........ *G01R 1/06711* (2013.01); *G01R 1/0675* (2013.01); *G01R 1/07357* (2013.01)

(58) Field of Classification Search
CPC .............. G01R 1/07357; G01R 1/0466; G01R 1/06727; G01R 1/07342; G01R 31/2863;
(Continued)

(56) References Cited

U.S. PATENT DOCUMENTS 4,622,514 A † 11/1986 Lewis
7,850,460 B2 * 12/2010 Weiland ............. G01R 1/06733
439/66

(Continued)

FOREIGN PATENT DOCUMENTS

JP 2012-173263 A † 9/2012
JP 2013-7700 A 1/2013
JP 2013-257299 A † 12/2013

*Primary Examiner* — Vinh P Nguyen
(74) *Attorney, Agent, or Firm* — Seed Intellectual Property Law Group LLP

(57) ABSTRACT

A testing head for functionality testing a device under test comprises a plurality of contact probes, each contact probe having a rod-like body having a preset length less than 5000 μm extending between a first and a second end, the second end being a contact tip and an opening extending all over its length and defining a plurality of arms, parallel to each other, separated by the opening and connected to the end portions of the contact probe, and an auxiliary guide, arranged transverse to the body and provided with suitable guide holes, the contact probes sliding through each of them, the auxiliary guide defining a gap including one end of the opening being a critical portion of the body and a zone more prone to breakings in the body undergoing low or even no bending stresses in the gap with respect to the rest of the body.

35 Claims, 9 Drawing Sheets

(58) Field of Classification Search
CPC ............ G01R 31/2887; G01R 1/06722; G01R 1/06711; G01R 1/0458; G01R 1/073; G01R 1/04; G01R 1/0408; G01R 1/067; G01R 1/06772; G01R 1/07307; G01R 1/07378; G01R 31/045; G01R 31/2808; G01R 31/2851; G01R 31/26; G01R 31/307; G01R 31/318505; G01R 31/31905; G01R 1/0416; G01R 1/0433; G01R 1/0491; G01R 1/0735; G01R 31/013; G01R 31/2642; G01R 31/2849; G01R 31/2865; H01R 12/714; H01R 12/52; H01R 13/193; H01R 13/2421; H01R 13/2435; H01R 12/7076; H01R 13/2428; H01R 13/2471; H01R 2201/20; H01R 43/205
See application file for complete search history.

(56) References Cited

U.S. PATENT DOCUMENTS

| | | | | |
|---|---|---|---|---|
| 7,888,958 | B2* | 2/2011 | Souma | G01R 1/06733 324/754.03 |
| 9,774,121 | B2* | 9/2017 | Kimura | H01R 13/2428 |
| 2004/0005792 | A1 | 1/2004 | Sabatier et al. | |
| 2009/0280676 | A1 | 11/2009 | Weiland et al. | |
| 2010/0231249 | A1 | 9/2010 | Dang et al. | |
| 2012/0242363 | A1† | 9/2012 | Breinlinger | |
| 2014/0043054 | A1 | 2/2014 | Kister | |
| 2014/0239995 | A1* | 8/2014 | Swart | G01R 1/06711 324/755.06 |
| 2015/0015289 | A1 | 1/2015 | Eldridge | |
| 2015/0280345 | A1 | 10/2015 | Kimura et al. | |
| 2018/0011126 | A1† | 1/2018 | Acconcia | |

\* cited by examiner
† cited by third party

TESTING HEAD COMPRISING VERTICAL PROBES WITH INTERNAL OPENINGS

BACKGROUND

Technical Field

The present disclosure refers to a testing head including a plurality of vertical probes, particularly for high frequency applications.

More specifically, the disclosure refers, particularly but not exclusively, to a testing head to test electronic devices being integrated on a wafer and the following description is made referring to this application field with the only purpose of simplifying the exposition.

Description of the Related Art

As it is well known, a testing head (or probe head) is a device suitable to electrically connect a plurality of contact pads of a microstructure to corresponding channels of a testing machine performing the functional test thereof, particularly the electrical one, or generically the test.

The test done on integrated circuits is useful to detect and isolate defective circuits while in the production phase. Normally, the testing heads are used for electrically testing the integrated circuits on wafer before cutting and assembling them inside a chip-containing package.

A testing head basically includes a plurality of mobile contact elements or contact probes being held by at least a pair of substantially plate-shaped supports or guides being parallel to each other. Those plate-shaped supports are provided with suitable holes and are arranged at a certain distance from each other in order to leave a free space or gap for the movement and possible deformation of the contact probes. The pair of plate-shaped supports particularly includes an upper plate-shaped support and a lower plate-shaped support, both provided with respective guiding holes where the contact probes axially slide, the probes being usually made of special alloy wires having good electrical and mechanical properties.

The good connection between testing probes and contact pads of the device under test is ensured by pressing the testing head onto the device itself, the contact probes, being movable inside the guiding holes made in the upper and lower plate-shaped supports during that pressing contact, undergoing a bending inside the gap between the two plate-shaped supports and sliding inside those guiding holes. Testing heads of this kind are usually called testing heads with "vertical probe".

Testing heads with vertical probes typically have a gap where a bending of the contact probes happens, that bending being able to be helped by a proper configuration of the probes themselves or of their supports, as schematically shown in FIG. 1, where, for the sake of illustration simplicity, only one contact probe of the plurality of probes normally included in a testing head has been shown.

Particularly, in FIG. 1 a testing head 1 is schematically shown including at least one lower plate-shaped support 3, usually called "lower die", and an upper plate-shaped support 2, usually called "upper die", having respective guide holes 3A and 2A inside which at least one contact probe 4 slides.

The contact probe 4 ends at an end with a contact tip 4A intended to abut onto a contact pad 5A of a device under test 5, in order to realize the electrical and mechanical contact between said device under test 5 and a testing apparatus (not shown) of which that testing head 1 forms a terminal element.

With the term "contact tip" herein and below it is meant an end zone or region of a contact probe intended to contact the device under test or the testing apparatus, such an end zone or region not necessarily being sharp.

In some cases, the contact probes are fixedly fastened to the head itself at the upper plate-shaped support: the testing heads are referred to as blocked probes testing heads.

More often however, testing heads having non-fixedly fastened probes are used, which are kept interfaced to a so-called board, possibly by means of a micro contact holder: the testing heads are referred to as non-blocked probes testing heads. The micro contact holder usually is called "space transformer" because, besides contacting the probes, it also allows spatially redistributing the contact pads made on it with respect to the contact pads of the device under test, particularly relaxing the distance constraints between the center of the pads themselves.

In this case, as shown in FIG. 1, the contact probe 4 has another contact tip, shown as contact head 4B, towards a pad 6A of a plurality of contact pads of the space transformer 6. The good electrical contact between probes 4 and space transformer 6 is ensured similarly to the contact with the device under test 5 by pressing the contact heads 4B of the contact probes 4 against the contact pads 6A of the space transformer 6.

The upper and lower plate-shaped supports 2 and 3 are suitably separated by a gap 7 allowing the deformation of the contact probes 4. Finally, the guide holes 2A and 3A are sized in order to allow the contact probe 4 to slide thereinto.

In case of a testing head made in the so-called "shifted plates" technology, the contact probes 4, also called "buckling beams", are made straight, the shift of the supports causing a bending of the body of the probes, and the desired holding of the probes themselves due to the friction with the walls of the guide holes where they slide. In that case, they are referred to as testing heads with shifted plates.

The shape of the bending to which the probes are undergoing and the force causes that bending depend on several factors, such as the physical characteristics of the alloy composing the probes and the value of the offset between the guide holes in the upper plate-shaped support and the corresponding guide holes in the lower plate-shaped support.

The proper operation of a testing head is bound to two parameters: the vertical movement, or overtravel, of the contact probes and the horizontal movement, or scrub, of the contact tips of those probes. It is known that it is important to ensure the scrub of the contact tips in order to allow scratching the surface of the contact pads removing the impurities, for example in the form of a thin oxide layer or film, thus improving the contact being carried out by the testing head.

All these characteristics are to be evaluated and calibrated in the manufacturing phase of a testing head, having to be always guaranteed the good electrical connection between probes and device under test, particularly between contact tips of the probes and contact pads of the device under test.

It is equally important to guarantee that the pressing contact of the contact tips of the probes onto the contact pad of the device is not as high as to cause the breaking of the probe or of the pad itself.

This issue is particularly felt with the so-called short probes, namely probes with a rod-like body having a limited length and particularly with dimensions less than 5000 µm.

This kind of probes are used for example in high frequency applications, where the reduced length of the probes limits the related self-inductance phenomenon. Particularly, with the term "high frequency applications" it is meant probes being able to carry signals having frequencies higher than 1000 MHz.

In that case, however, the reduced length of the body of the probes steeply increases the stiffness of the probe itself, which implies an increase of the force being exerted by the respective contact tip on the contact pads, for example of a device under test, which can lead to break those pads, irreparably damaging the device under test, a circumstance that should be avoided. In a more dangerous way, the increase of the stiffness of the contact probe, due to the reduction of its body length, increases the risk of breaking the probes themselves.

A multipath probe is disclosed for instance in the US Patent Publication No. US 2015/0015289 to Eldridge. According to an embodiment, the probe has a configuration with leaves. Moreover, the PCT application published under No. WO 2014/087906 on Jun. 12, 2014 in the name of Japan Electronic Material Corp discloses an electrical contact probe, having a layered structure and comprising an elastic deformation part formed to include three beam parts of which adjacent ones are arranged through a gap, such a configuration making it possible to shorten the length of the probe to improve the high frequency characteristics of the contact probe while ensuring an overdrive amount and probe pressure. Also known from the US Patent Publication No. US 2012/0242363 to Breinlinger et al. is an electrically conductive contact element including a first base and a second base with elongate, spaced apart leaves between the bases, opposite first and second ends of each leaf being coupled to the first and second bases.

BRIEF SUMMARY

An embodiment of the disclosure is directed to a testing head having such functional and structural characteristics to allow using it in high frequency applications with probes having a length less than 5000 μm, yet guaranteeing enough elasticity of the contact probes and thus lowering the risk of breaking them, and the force that the corresponding end portions exert when abutting onto the corresponding contact pads, overcoming the limitations and the drawbacks still conditioning the testing heads being realized according to the known art.

According to an aspect of the disclosure, the testing head with probes has an opening extending along the corresponding rod-like bodies, being able to reduce the stiffness of the probes and accordingly the pressure being exerted by the probes on the contact pads, at the same time guaranteeing enough elasticity of the body of those probes, that opening being arranged in order to have at least its portion being particularly subject to breaking located at one zone of the testing head having reduced stresses, particularly flexural ones.

More particularly, the testing head with vertical contact probes for the functionality testing of a device under test comprises a plurality of vertical contact probes, each vertical contact probe having a rod-like body having a preset length extending between a first and a second end, the second end being a contact tip adapted to abut onto a contact pad of the device under test, the body of each of the vertical contact probes having a length less than 5000 μm, and comprises at least one opening extending all over its length and defining a plurality of arms, parallel to each other, separated by the at least one opening and connected to the end portions of the vertical contact probe, characterised in that the testing head also comprises at least one auxiliary guide, arranged along the body in parallel to a plane defined by the device under test and provided with suitable guide holes and one vertical contact probe sliding through each of them, the auxiliary guide being adapted to define a gap including one end of the at least one opening being a critical portion of the body of the vertical contact probe, namely a zone more prone to breakings in the body, the critical portion being positioned in the gap so that it undergoes low or even no bending stresses with respect to the rest of the body.

It should be underlined that the critical portion corresponds to a portion where a clear change in the cross-section occurs, therefore determining a remarkable concentration of mechanical stresses.

More particularly, the testing head comprises the following additional and optional characteristics, taken individually or in combination if necessary.

According to another aspect of the disclosure, for a testing head having vertical contact probes with respective contact heads fixedly coupled to a support at a contact area, where the auxiliary guide can define the gap together with the support, a further gap (31) being defined in that case between the auxiliary guide and the plane defined by the device under test.

According to another aspect of the disclosure, for a testing head having at least one lower guide and one upper guide, being flat and parallel to each other and provided with respective guide holes, inside which a respective vertical contact probe is housed, having a contact head adapted to abut onto a contact pad of a space transformer, the auxiliary guide, together with the upper guide or the lower guide respectively, can define the gap including one end of the at least one opening.

In that case, the testing head can include a further auxiliary guide arranged along the body of the vertical contact probes, in parallel to the planes of the lower, upper and auxiliary guides, provided with suitable guide holes where one vertical contact probe slides through each of them and arranged between the auxiliary guide and the lower guide or the upper guide respectively, wherein the further auxiliary guide together with the lower guide or the upper guide respectively, can define an additional gap including a further end of the at least one opening being a further critical portion of the body of the vertical contact probe, a further gap being defined in that case between the auxiliary guide and the further auxiliary guide and not comprising the critical portions of the body.

According to another aspect of the disclosure, the further gap can have a length between 1000 μm and 4000 μm, preferably between 2000 μm and 3000 μm and the gap and possibly the additional gap can have lengths between 100 μm and 500 μm, preferably between 200 μm and 300 μm.

According to another aspect of the disclosure, the vertical contact probe can include a plurality of openings realized in the body, all along its length and being parallel to each other, adapted to define the plurality of arms.

According to another aspect of the disclosure, the vertical contact probe can further include material bridges arranged inside the opening and adapted to connect the arms so defined in the body to each other, the material bridge acting as strengthening elements.

Particularly, the material bridges can be arranged inside the gap or inside the additional gap or inside the further gap.

According to another aspect of the disclosure, each vertical contact probe can also include at least one protruding element or stopper starting from one of its lateral walls, the at least one stopper being realized in correspondence of one wall of a guide hole of a guide above the same and contacting the lateral wall of the vertical contact probe.

Conveniently, the testing head can include further vertical contact probes without openings, the vertical contact probes provided with openings being apt to abut onto contact pads belonging to a power region of the device under test and the further vertical contact probes without openings being apt to abut onto further contact pads belonging to a signal region of the device under test, the contact pads having greater dimensions and pitch than the further contact pads.

According to another aspect of the disclosure, the further vertical contact probes without openings can have a probe diameter smaller than a probe diameter of the vertical contact probes provided with openings.

Particularly, the vertical contact probes provided with openings can be apt to carry first signals, particularly the supply ones, having higher current values than second signals, particularly the input/output ones, the further vertical contact probes without openings being apt to carry the second signals.

Finally, the vertical contact probes provided with openings and the further vertical contact probes without openings can have the same length.

The characteristics and advantages of the testing head according to the disclosure will be evident from the description, made in the following, of one embodiment example thereof given by way of non-limiting example referring to the attached drawings.

DETAILED DESCRIPTION

Figure 1:
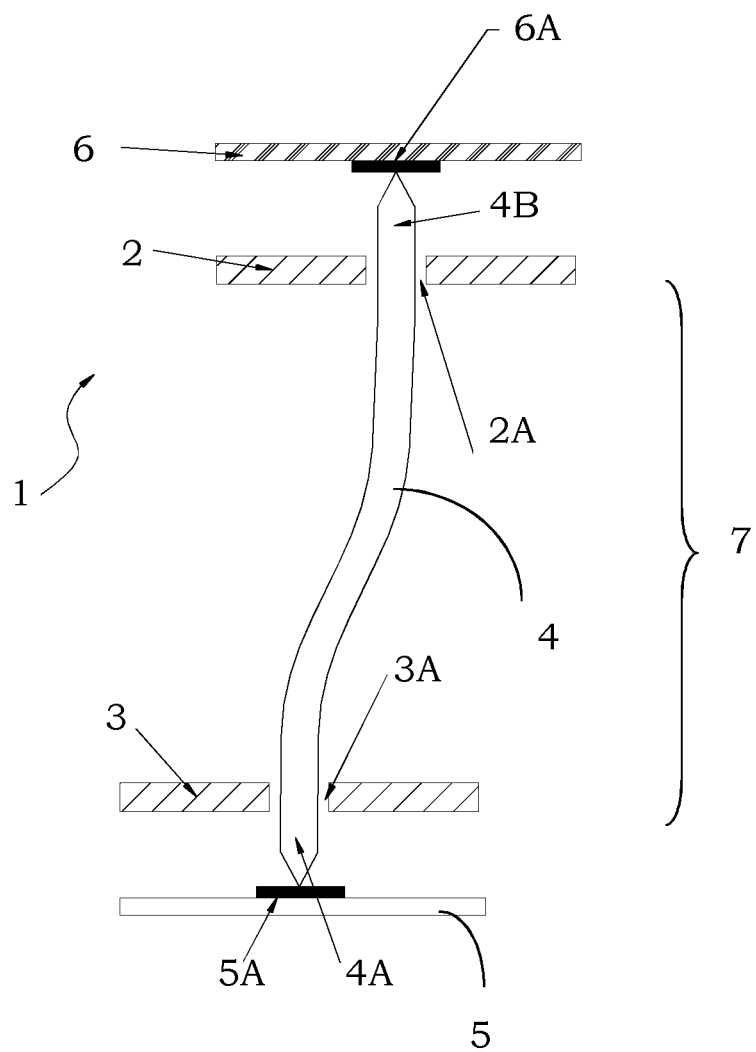
FIG. 1 schematically shows a testing head being realized according to the known art.
Figure 2:
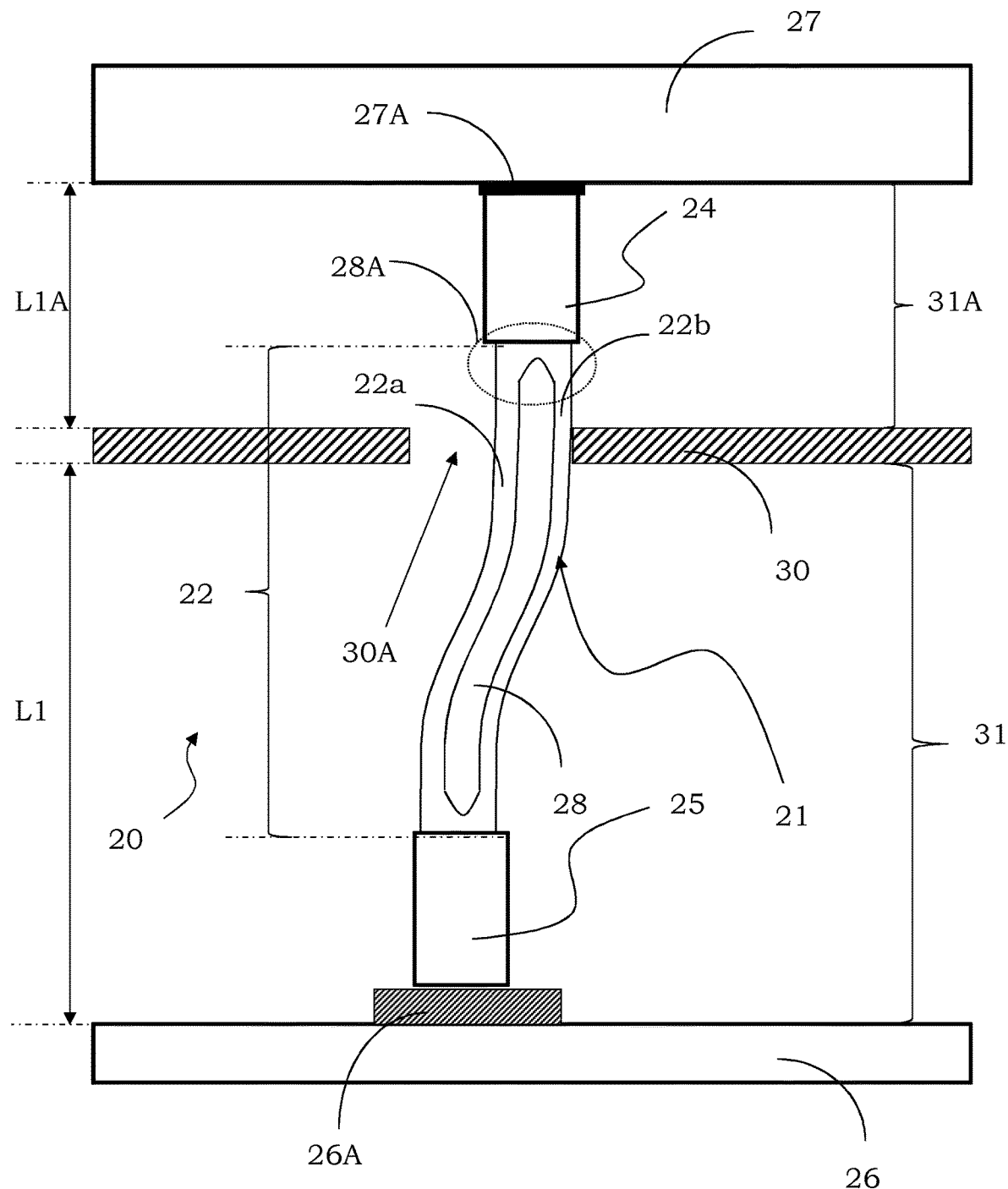
FIG. 2 schematically shows an embodiment of the testing head according to the disclosure.

Referring to those figures, and particularly to FIG. 2, a testing head being realized according to the disclosure is described and shown, globally indicated as 20.

It should be noted that the figures represent schematic views and they are not drawn at scale, but instead are drawn in order to emphasize the important characteristics of the disclosure. Moreover, in the figures, the different parts are shown in a schematic way, their shape being able to change according to the desired application.

The testing head 20 includes a plurality of contact probes, each having at least one contact end suitable to abut onto a contact pad of a device under test. For the sake of illustration, simplicity and clarity, in the figures only one contact probe 21 is shown, including a rod-like body 22 having a preset length, intended as the longitudinal dimension of that body 22 in a non-warped configuration.

More particularly, the testing head 20 is of the so-called short probes type, used for example for high frequency applications; in that case, each contact probe 21 includes a body 22 having a length less than 5000 μm.

Each contact probe 21 also includes at least one first and one second end portion, particularly a contact head 24 and a contact tip 25, being contiguous to the body 22.

In the embodiment shown in FIG. 2, the probe type is the free body one and it has the contact head 24 fixedly coupled, for example soldered, to a support 27, for example a ceramic one, particularly at a contact area 27A, while the contact tip 25 is suitable to abut onto contact pads 26A of a device under test 26.

Conveniently, each contact probe 21 also includes an opening 28, extending along the body 22, substantially for all the length of the same. In other words, the body 22 of the contact probe 21 is therefore formed by at least one first and one second arm, 22a and 22b, being substantially parallel to each other, separated by the opening 28 and connected to the end portions, particularly to the contact head 24 and contact tip 25.

In that way, the stiffness of the contact probe 21 is significantly reduced. Moreover, the contact probe 21 exerts less force on the contact pad 26A of the device under test 26 with respect to a known contact probe having the same dimensions, without the opening 28.

However, tests made by the applicants underlined that, due to compression forces and moreover to bending forces to which the contact probe 21, particularly its body 22, undergoes during the testing head 20 life which includes it, during the thousands of touch operations for the contact between the contact tip 25 and the contact pad 26A of the device under test 26, exists at least one critical portion 28A of the body 22 that is prone to breakings, particularly near the junction of the arms 22a and 22b, which drastically reduces the useful life of the testing head 20. More particularly, it is verified that at least one critical portion 28A is at one end of the opening 28 near the contact head 24.

Particularly, the critical portion 28A corresponds to a portion where a clear change in the cross-section occurs therefore determining a remarkable concentration of mechanical stresses.

Conveniently, according to the present disclosure, the testing head 20 therefore includes at least one plate-shaped support or auxiliary guide 30, arranged along the body 22 in parallel with a plane defined by the support 27 or also by the device under test 26, usually being flat and parallel to each other, in order to define a gap 31 between that auxiliary guide 30 and the device under test 26, which does not include the critical portion 28A. Consequently, it is also defined an additional gap 31A, between the auxiliary guide 30 and the support 27, where the at least one critical portion 28A of the contact probe 21 is placed.

In other words, referring to the embodiment and to the local reference of FIG. 2, the auxiliary guide 30 is arranged along the body 22 under the critical portion 28A and near the same.

The auxiliary guide 30 is also provided with suitable guide holes 30A and a contact probe 21 sliding through each of them.

It should be underlined that the additional gap 31A defined by the auxiliary guide 30 is at a portion of the contact probe 21 with low bending stresses, particularly lower than those of the gap 31, which reduces the likelihood of breaking near the junctions of the body 22 arms at the critical portion 28A contained in that additional gap 31A.

Conveniently, the gap 31 has a length L1, defined as the distance between an undercut surface of the auxiliary guide 30 and a surface of the device under test 26 including the contact pads 26A; the length L1 of the gap 31 is between 1000 μm and 4000 μm, preferably between 2000 μm and 3000 μm. In a similar way, the additional gap 31A has a length L1A, defined as the distance between a surface opposing the undercut surface of the auxiliary guide 30 and a surface of the support 27 to which the contact head 24 of the contact probe 21 is connected, particularly soldered; the length L1A of the additional gap 31A is between 100 μm and 500 μm, preferably between 200 μm and 300 μm.

Advantageously according to the present disclosure, the combined use of a contact probe 21 provided with at least one opening 28 being realized in its body 22 and an auxiliary guide 30 suitable to define an additional gap 31A where the contact probe 21 undergoes low or even no bending stresses and including a critical portion 28A, namely a zone more prone to breaking, being introduced in the body 22 by the opening 28, allows realizing a testing head 20 with short vertical probes, namely having lengths less than 5000 μm, therefore being suitable for high frequency applications, with a useful life comparable if not longer than those of the known testing heads. Particularly, the use of the opening 28 allows reducing the stiffness of the body of the contact probe 21 and at the same time reducing the impact pressure of the contact tip 25 of the probe on a contact pad 26A of the device under test 26 while the presence of the auxiliary guide 30 defining the additional gap 31A that includes the critical portion 28A of the contact probe 21 allows reducing or even nulling the likelihood of breaking that probe at the critical portion 28A.

Thanks to the above-described synergy of the adopted expedients, the contact head realized according to the present disclosure is suitable for high frequency applications and has a long useful life, with a reduction of the likelihood of breaking the probes due to the excessive stiffness or at critical portions introduced by the opening presence.

Figure 3A:
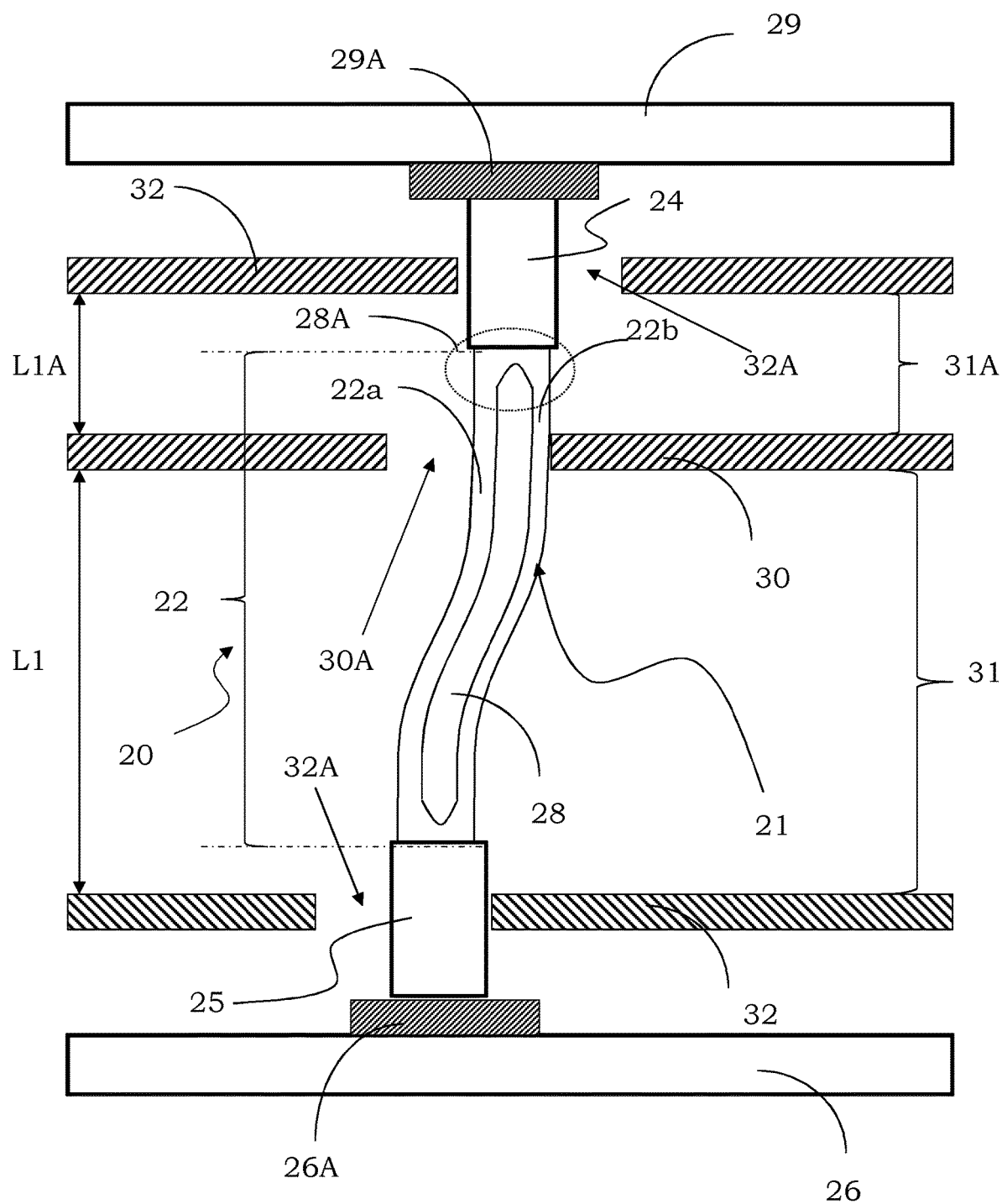
FIGS. 3A-3B, 4A-4B, 5A-5B and 6 schematically show alternative embodiments of the testing head according to the disclosure.

It is also possible to realize the testing head 20 of the so-called shifted plates type, as schematically shown in FIG. 3A, particularly including at least one plate-shaped support or lower guide 32, usually called "lower die", and at least one plate-shaped support or upper guide 33, usually called "upper die", being flat and parallel to each other and provided with respective guide holes, 32A and 33A, inside which a plurality of contact probes are slidingly housed, in the figure being always shown only one for sake of simplicity.

In the example shown in FIG. 3A, the testing head 20 is also of the non-fastened probes type and the contact head 24 of each contact probe 21 is suitable to abut onto contact pads 29A of a space transformer 29.

In that case too, each contact probe 21 includes one opening 28, extending along the body 22, substantially for all the length of the same, thus defining at least one first and one second arm, 22a and 22b, substantially parallel to each other, separated by the opening 28 and connected at the end portions of the contact probe 21, particularly at the contact head 24 and the contact tip 25. The opening 28 substantially has a cut shape developing along the body 22 of the contact probe 21 between respective ends, arranged at the contact head 24 and the contact tip 25.

Moreover, the testing head 20 also includes at least a plate-shaped support or auxiliary guide 30, arranged along the body 22 in parallel with the planes of the lower and upper guides, 32 and 33, being in turn parallel to the planes of the device under test 26 and the space transformer 29, usually being parallel to each other. In this case too, it is defined a gap 31 between the auxiliary guide 30 and the lower guide 32, which does not include the at least one critical portion 28A introduced in the body 22 of the contact probe 21 by the opening 28, intended as a portion of that body 22 which is most prone to breakings following the stresses, particularly the bending ones, to which the contact probe 21 undergoes during the operation of the testing head 20.

As above, it is also defined an additional gap 31A, between the auxiliary guide 30 and the upper guide 33, where the critical portion 28A is placed.

Also in that case, the additional gap 31A corresponds to a portion of the contact probe 21 with low bending stresses, which reduces the likelihood of breaking the body 22 at the critical portion 28A contained therein.

The gap 31 has a length L1, defined as the distance between an undercut surface of the auxiliary guide 30 and a surface of the lower guide 32 internal to the gap 31 itself; as above, the length L1 can have values between 1000 μm and 4000 μm, preferably between 2000 μm and 3000 μm.

The additional gap 31A has a length L1A, defined as the distance between a surface opposing the undercut surface of the auxiliary guide 30 and an undercut surface of the upper guide 33; the length L1A of the additional gap 31A can have values between 100 μm and 500 μm, preferably between 200 μm and 300 μm.

Figure 3B:
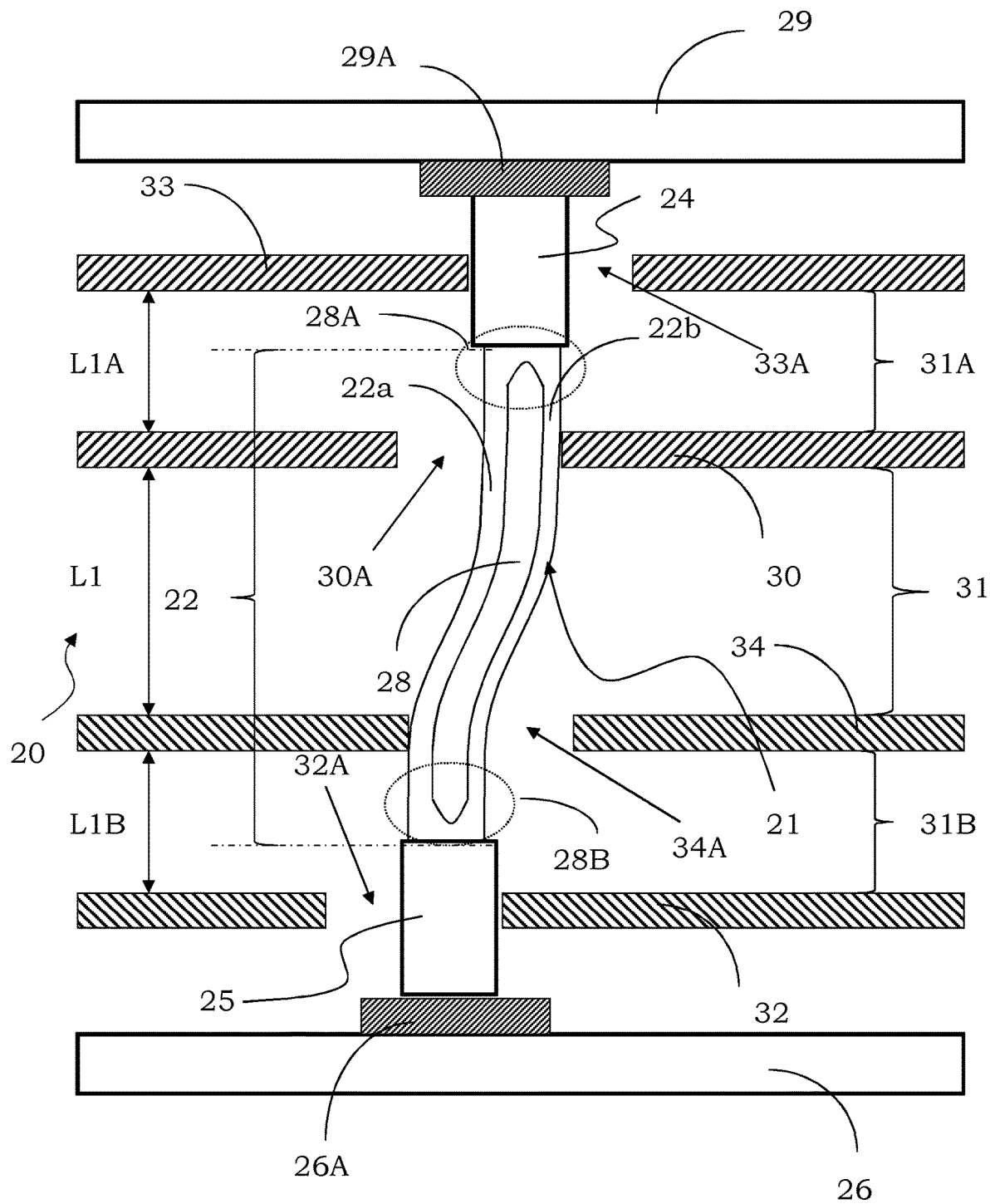

According to an alternative embodiment shown in FIG. 3B, the testing head 20 can also include at least one further auxiliary guide 34, arranged along the body 22 in parallel with the planes of the lower, upper and auxiliary guides, 32, 33 and 30, being in turn flat and parallel to each other and to the planes of the device under test 26 and of the space transformer 29, usually being parallel to each other, and particularly arranged between the auxiliary guide 30 and the lower guide 32.

Such a further auxiliary guide 34 is able to define a further additional gap 31B, enclosing a further critical portion 28B of the body 22 which is prone to breakings, particularly of the arms 22a and 22b, being arranged at a further end of the opening 28 near the contact tip 25.

In other words, referring to the embodiment and to the local reference of FIG. 3B, the further auxiliary guide 34 is arranged along the body 22 above the critical portion 28B and near the same.

Also in that case, the further additional gap 31B corresponds to a portion of the contact probe 21 with low bending stresses, which reduces the likelihood of breaking the body 22 at the critical portion 28B contained therein.

Clearly, it is possible to consider a testing head 20 including an auxiliary guide 30 arranged between the upper guide 33 and the lower guide 32 in order to define the additional gap 31A, between the auxiliary guide 30 and the upper guide 33, where the critical portion 28A is placed, at one end of the opening 28 near the contact head 24.

In a similar way, in that case the testing head 20 could include a further auxiliary guide 34, arranged between the auxiliary guide 30 and the lower guide 32 in order to define a further additional gap 31B, enclosing a further critical portion 28B of the body 22 which is prone to breakings, being arranged at a further end of the opening 28 near the contact tip 25.

Referring to the example shown in the figure, due to the presence of the auxiliary guide 30 and of the further auxiliary guide 34, there are defined one gap 31 between the auxiliary guide 30 and the further auxiliary guide 34, not including the critical portions 28A and 28B, one additional gap 31A, between the auxiliary guide 30 and the upper guide 33, where the critical portion 28A is placed and one further additional gap 31B, between the further auxiliary guide 34 and the lower guide 32, where the further critical portion 28B is placed.

Clearly, in that case the length L1 of the gap 31 is defined as the distance between the walls of the auxiliary guide 30 and the further auxiliary guide 34 facing inside it, while the further additional gap 31B has a length L1B intended as the distance between the walls of the further auxiliary guide 34 and the lower guide 32 facing inside it.

It is possible to consider the same ranges of values shown above for the embodiment of the FIG. 3A for the length L1A of the additional gap 31A also for the length L1B of the further additional gap 31B.

It should be underlined that the embodiment of the testing head 20 shown in FIG. 3B further reduces the likelihood of breaking due to stresses, particularly the bending ones, of the contact probes 21 provided with respective openings 28 making them suitable for high frequency applications, thanks to the placement of the auxiliary guide 30 and the further auxiliary guide 34 enclosing the critical portions 28A and 28B in zones with low or very low stresses, particularly the bending ones. Therefore, it is expected that the testing head 20 have a proper useful life duration, particularly longer than the known solutions.

It is also possible, according to an alternative embodiment of the testing head 20 according to the present disclosure, to provide the body 22 of the contact probes 21 included therein with a plurality of openings suitable to define a plurality of arms along that body 22, being substantially parallel to each other and separated by the openings.

Figure 4A:
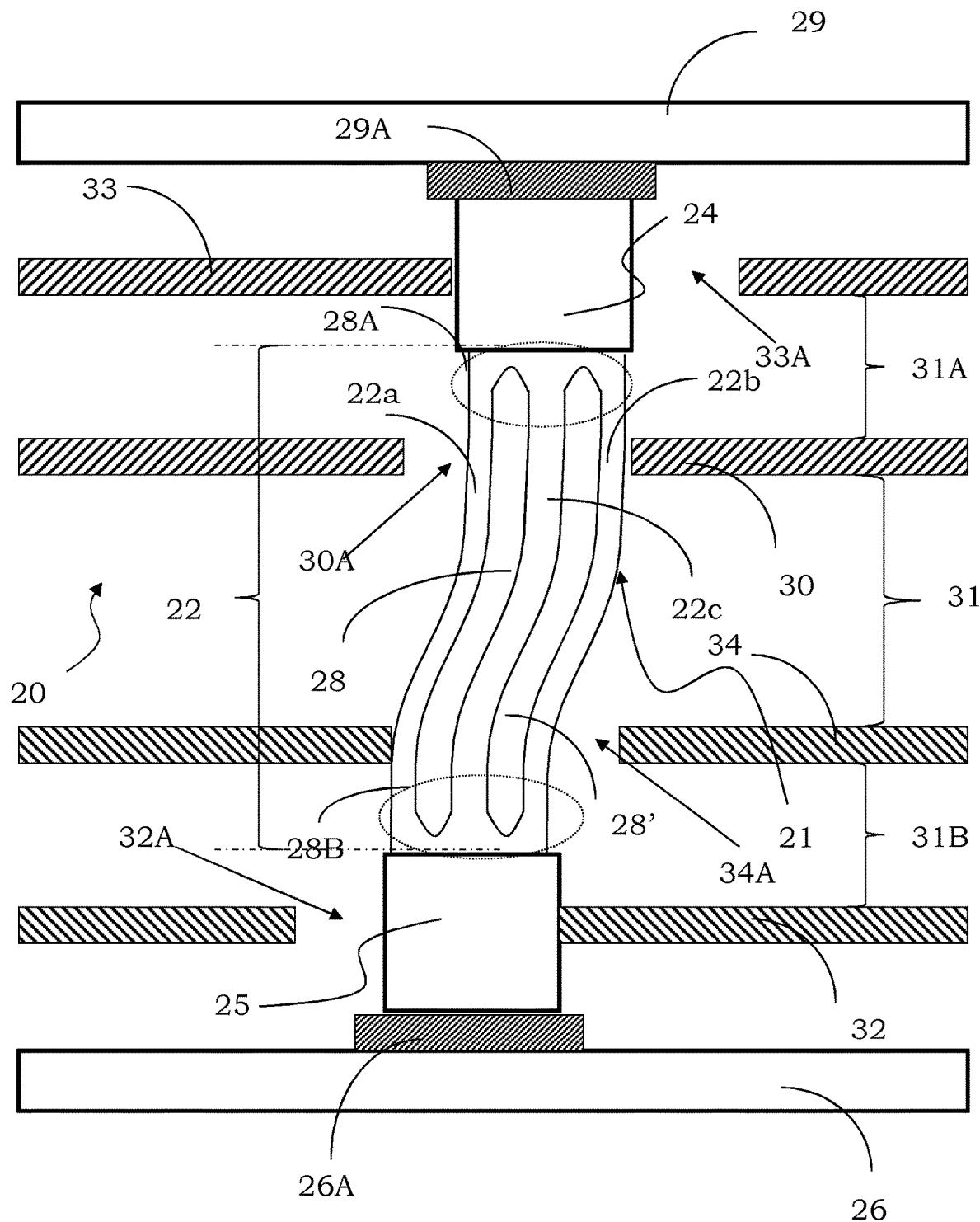

For the sake of illustration simplicity, in FIG. 4A it is shown a contact probe 21 having at least one first opening 28 and one second opening 28', being able to define in its body 22 a first, a second and a third arm, 22a, 22b and 22c. As above, the openings 28 and 28' extend along all the body 22 between respective ends at the contact head 24 and the contact tip 25. Clearly, it is possible to consider a plurality of openings having a different length, as shown by way of example only.

Moreover, advantageously according to the present disclosure, the testing head 20 includes at least one auxiliary guide 30 suitable to define one additional gap 31A where the probe undergoes to low or very low stresses, mainly the bending ones, and where at least one critical portion 28A is placed, at one end of the openings 28 and 28'. Furthermore, as in the case of FIG. 4A, the testing head 20 can also include a further auxiliary guide 34, suitable to define a further additional gap 31B where a further critical portion 28B is placed, at the other end of the openings 28, 28'.

Figure 4B:
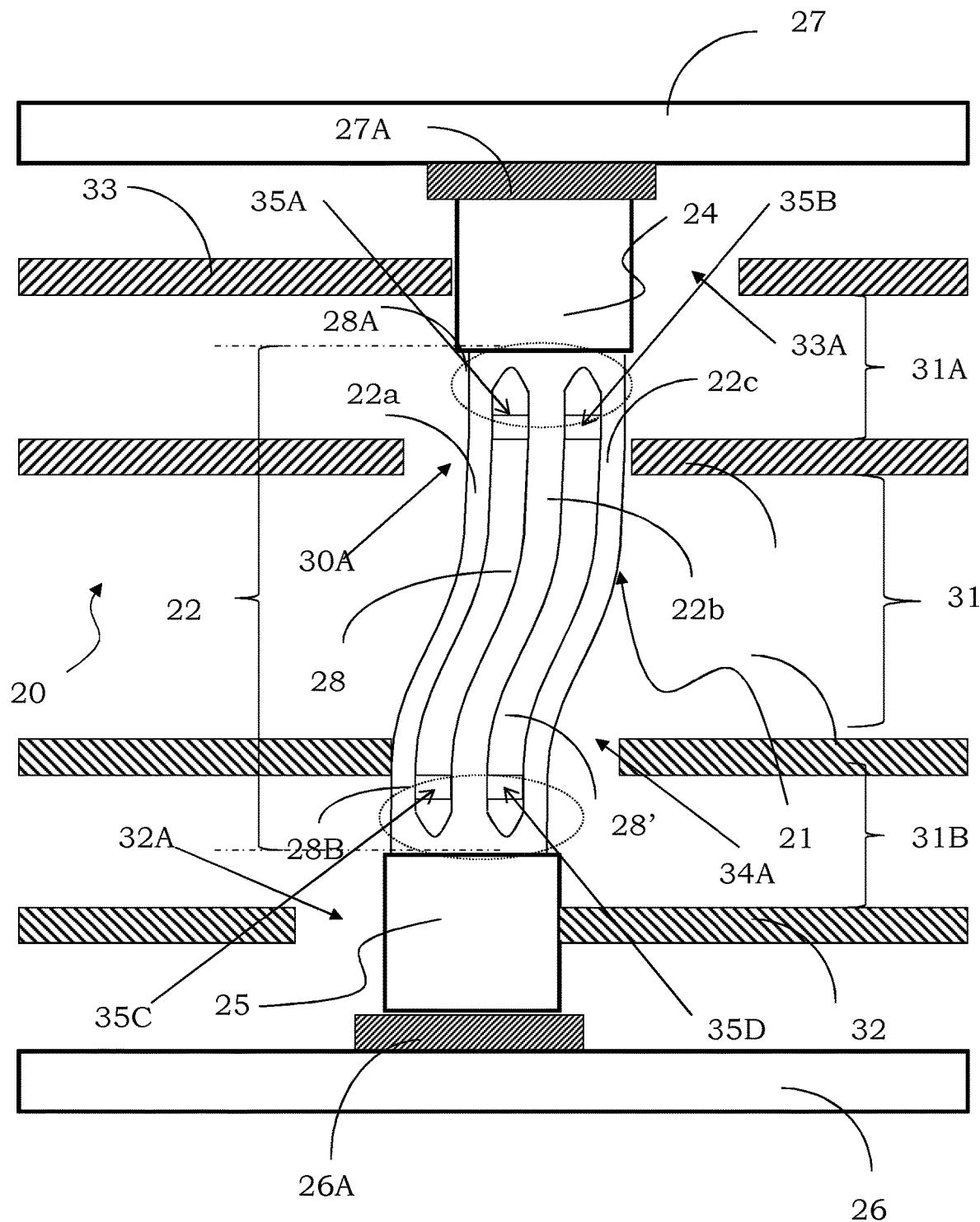

According to a further alternative embodiment, schematically shown in FIG. 4B, the contact probe 21 can also include material bridges 35 being arranged inside the openings 28 and suitable to connect to each other the arms of the body 22, which are defined by those openings, substantially acting like strengthening elements. Advantageously according to the present disclosure, those material bridges 35 are placed inside the critical portions of the contact probe 21.

More particularly, in the example shown in FIG. 4B, four material bridges, 35A, 35B, 35C and 35D are shown, which are arranged in pairs in the critical portion 28A and in the further critical portion 28B between the first arm 22a and the second arm 22b, respectively between the second arm 22b and the third arm 22c, namely at the first opening 28 and the second opening 28'.

Alternatively, the material bridges 35 can be made inside the gap 31.

It should be underlined that the material bridges 35 particularly can be defined by a non-continuous opening 28, being interrupted exactly at those bridges.

Finally, tests made by the applicant, have been able to verify that the presence of the auxiliary guide 30 in addition to the upper guide 33, in case of a testing head of the shifted plate type, significantly increases the sliding of the contact probes 21 inside the respective guide holes, 30A and 33A.

Particularly, it is well known to move the lower guide 32 and the upper guide 33 with respect to each other in order to realize a desired bending of the body 22 of the contact probe 21. Furthermore, again similarly to the known art and as shown above, it is also possible to move the upper guide 33 and the auxiliary guide 30 with respect to each other in order to realize the desired holding of the probes inside the testing head 20. However, the holding of the contact probes 21 obtained with the relative movement of the upper guide 33 and the auxiliary guide 30 is not able to avoid the contact probes 21 from sliding outside the testing head 20 in the absence of a device under test 26 or a space transformer 29. Similar considerations can be made taking in account the lower guide 32 and the further auxiliary guide 34, if present.

Figure 5A:
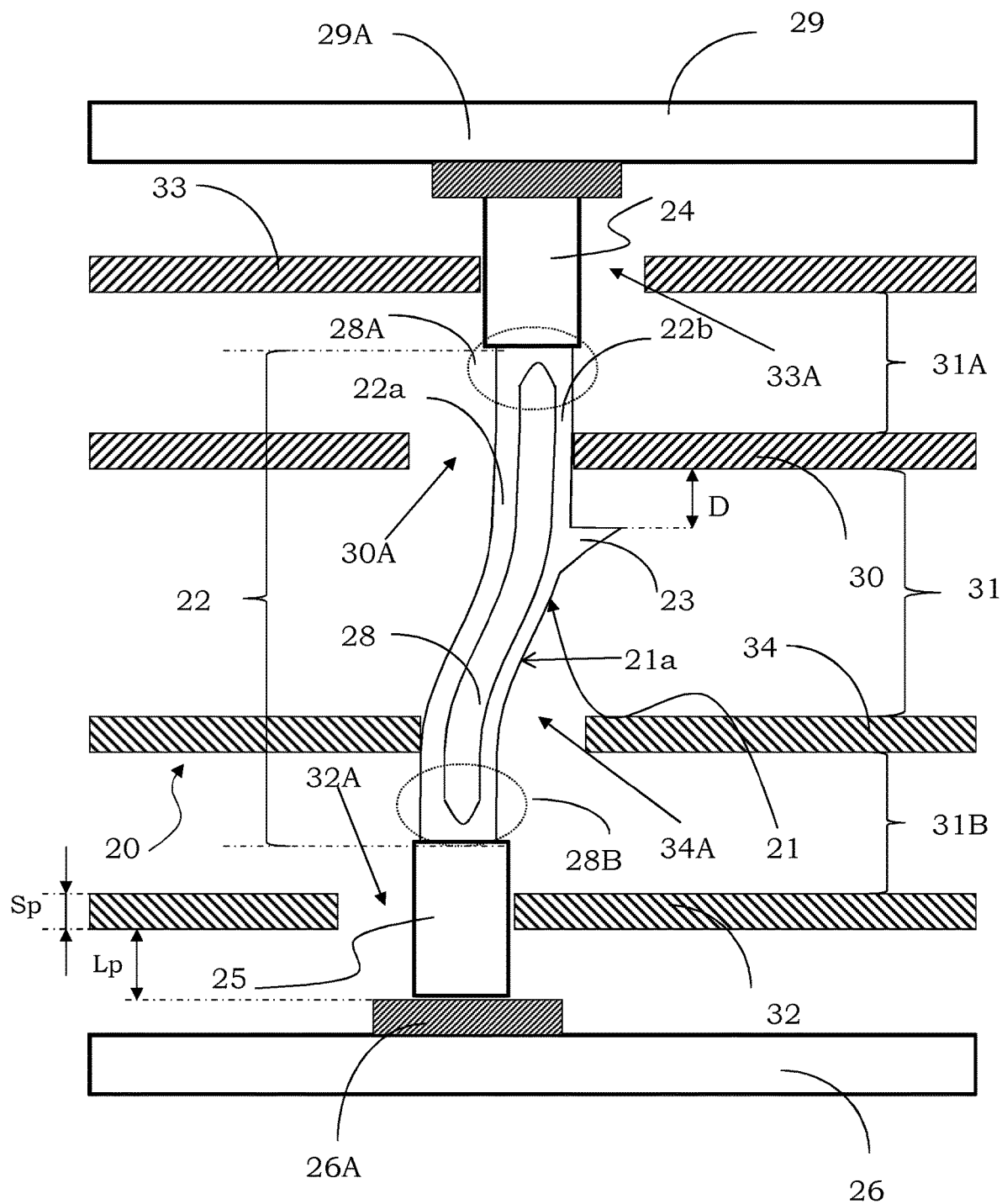

Advantageously according to an alternative embodiment of the testing head 20 of the present disclosure, schematically shown in FIG. 5A, the contact probe 21 also includes at least one element protruding from the corresponding body 22, at one of its walls. That protruding element is particularly realizes stopping means of the contact probe 21 suitable to prevent the contact probe 21 from coming out form the testing head 20 also in the absence of a device under test 26 or a space transformer 29 and it will be indicated in the following as stopper 23. Conveniently, the stopper 23 is integral with the body 22 of the contact probe 21.

Particularly, the stopper 26 is able to prevent an upwards movement (in the local reference of FIG. 5A) of the corresponding contact probe 21.

In a preferred embodiment being shown in the figure, the stopper 26 is tooth-shaped, being integral with the body 22 of the contact probe 21, protruding from the body 22 with a lateral protrusion whose dimension is comparable to the diameter of the contact probe 21 and particularly is between 5 and 40 μm, where with comparable it is meant that the difference between that overall lateral dimension and the diameter of the contact probe 21 is less than 20%. With the term diameter, herein and in the following, it is meant a maximum transversal dimension, also in case of non-circular cross-sections.

In the embodiment shown in FIG. 5A, the stopper 26 is placed in the gap 31 protruding from a wall 21a of the contact probe 21 suitable to contact a wall of a guide hole 30A of the auxiliary guide 30 above it.

It should be underlined that the stopper 23 is placed along the body 22 of the contact probe 21 so that, during the normal operation of the corresponding testing head 20, the stopper 23 is not contacting the auxiliary guide 30, in order not to interfere with the movement of the corresponding contact probe 21. In that way, the stopper 23 only acts on the occasion of a possible upwards movement of the contact probe 21, for example in case of the removal of the space transformer 29 and the undesired, even if temporary, "sticking" between the contact heads 24 of the probes and the contact pads 29A of the space transformer 29.

Actually, the stopper 23 is placed at the wall of the guide hole 30A of the auxiliary guide 30 which exactly abuts on the wall 21a of the contact probe 21 from which the stopper 23 protrudes, guaranteeing that the same abuts onto the undercut surface of the auxiliary guide 30 if the contact probe 21 tries to move upwards, again in the local reference of FIG. 5A.

It should be also underlined that the stopper 23 is able to prevent undesired movements of the contact probes 21 on the occasion of cleaning operations of the testing head 20, which, as it is well known, are usually carried out by means of powerful air jets, particularly being able to move the contact probes, the movements being encouraged by the enhanced sliding of the probes in the guide holes due to the presence of the auxiliary guide 30.

Furthermore, being not shown because conventional, the contact head 24 can be realized in order to have greater dimensions than the diameter of the guide holes 33A being realized in the upper support 33, preventing a downwards sliding (in the local reference of FIG. 5A) of the corresponding contact probe 21. With the term diameter, it is anyway meant a maximum transversal dimension, also in case of non-circular cross-sections.

In one alternative embodiment, the contact probe 21 includes at least one stopper 23' being realized protruding from a further wall 21b opposite to the wall 21a and placed in the additional gap 31A; particularly, the further wall 21b is suitable to contact a wall of a guide hole 33A of the upper guide 33 above it.

It should be underlined that the placement of the stopper 23' between the upper guide 33 and the auxiliary guide 30, namely in the additional gap 31A, is particularly advantageous since it is a zone with reduced stresses, particularly almost free from bending. In that way, there is no risk to trigger undesired breakings just at the stopper 23, whose shape protruding from the wall of the contact probe 21 inevitably introduces stress accumulation points.

It is necessary to underline that the guide holes being realized in the different guides, 32, 33, 30 or 34 are properly sized in order to allow the passage of the contact probe 21 also at the stopper 23.

More particularly, the guide holes are made with a diameter that corresponds to the sum of the diameter of the contact probe 21 and the overall lateral dimension of the stopper 23, plus a value accounting for the process tolerances.

Figure 5B:
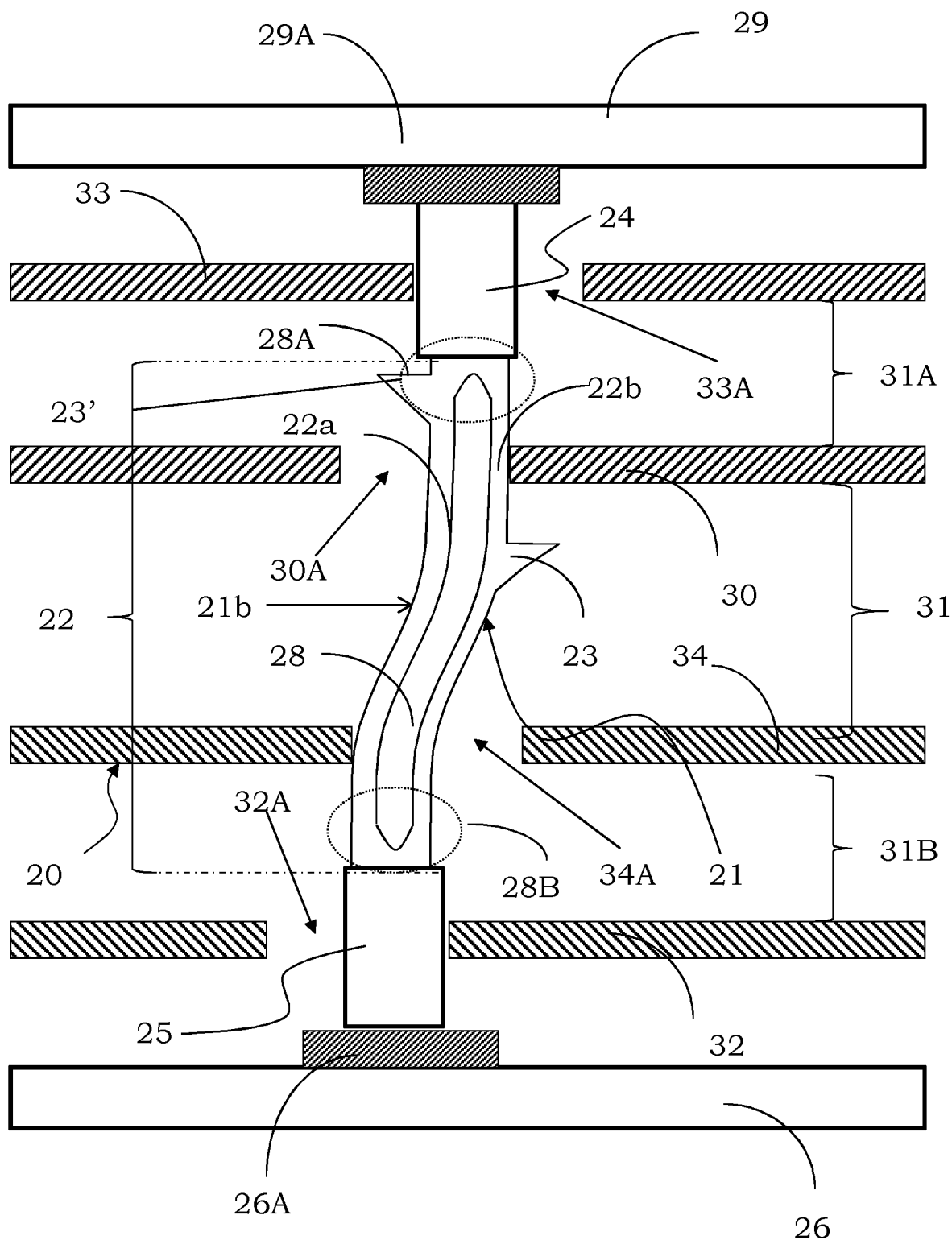

In the example shown in FIG. 5B, the contact probe 21 includes the stopper 23 placed in the gap 31 and a further stopper 23' placed in the additional gap 31A, being protruding from opposite walls 21a and 21b of the contact probe 21.

With such a configuration, both the stoppers 23, 23' are at the wall of the contact probe 21 contacting the wall of a respective guide hole and therefore guarantee an enhanced holding of the contact probe 21 inside the testing head 20 and prevent any possible upwards movement thereof with a double force.

Alternatively, it is possible to consider that those stoppers 23 and 23' protrude starting from the same wall 21a or 21b of the contact probe 21.

In that way, in fact, at least one of the stoppers 23 and 23' is prevented in its movement through the guide holes because it is at a wall of the guide hole contacting a wall of the contact probe 21, independently from the bending of the probe itself, which is usually called mounting angle of the probe, while the embodiment shown in FIG. 5B can be used for a single mounting angle of the contact probe 21.

Moreover, the stoppers 23, 23' introduce an overall dimension in the same direction, therefore guaranteeing the minimization of the value of minimum diameter that should be considered when realizing the guide holes of the guide 32, 33, 30 and 34, if present.

According to a further embodiment (not shown), the contact probe 21 can include at least four stoppers protruding from the walls of the contact probe 21 and being arranged in pairs in the additional gap 31A and gap 31, respectively.

In that way, it is possible to guarantee an enhanced holding due to the fact that a pair of stoppers is always suitable to abut onto an undercut wall of the guide on the occasion of an undesired upwards movement of the contact probe 21, independently from its mounting angle.

Again, it should be underlined that, in all the alternative embodiments being described, during the normal operation of the testing head 20, the stopper 23 is not contacting the guides 33 or 30, in order not to interfere with the movement of the corresponding contact probe 21. Conveniently, the stopper 23 instead acts in order to prevent an upwards movement of the contact probe 21, for example on the occasion of the removal of the space transformer 29.

Particularly, it should be underlined that the stopper 23 is placed in order to prevent the contact tip 25 of the contact probe 21 being able to come out from the lower support 32, particularly from the corresponding guide hole 32A. Actually, the contact tip 25 coming out makes the testing head 20 including such a contact probe 21 unusable, without a new alignment of the guide hole 32A to the contact tip 25 once the contact probe 21 is put back in position.

Therefore, the stopper 23 is placed at a distance D from the guide above it, for example the auxiliary guide 30 as in the case shown in FIG. 5A, particularly from the undercut wall of that auxiliary guide 30, having a value less than the sum of the length Lp of the contact tip 24 protruding from the lower guide 32 outside the testing head 20 and the thickness Sp of the lower guide 32, particularly corresponding to the height of the corresponding guide hole 32A, namely D<Lp+Sp. It should be underlined that the suitable placement of the stopper 23 is particularly advantageous in the case of the contact probes of the buckling beams type; actually in that case, the possible extraction of the contact tip 25 of a contact probe 21 from the guide hole 32A of the lower guide 32 causes a sudden straightening of the probe itself, which would prevent any attempt of putting back in position the same.

Moreover, the stopper 23 can be advantageously placed at a distance D greater than a minimum value equal to 5-10 µm, in order to guarantee that the stopper 23 does not interfere with the normal operation of the testing head 20 including the contact probe 21. In order to avoid any interference problem, the distance D preferably is chosen in order to be greater than 100 µm, more preferably greater than 150 µm.

Conveniently, the contact probes 21 provided with the openings 28 can be realized having higher diameters with respect to the traditional contact probes without those openings, without risks of breaking the probes themselves or the pads they are contacting.

Figure 6:
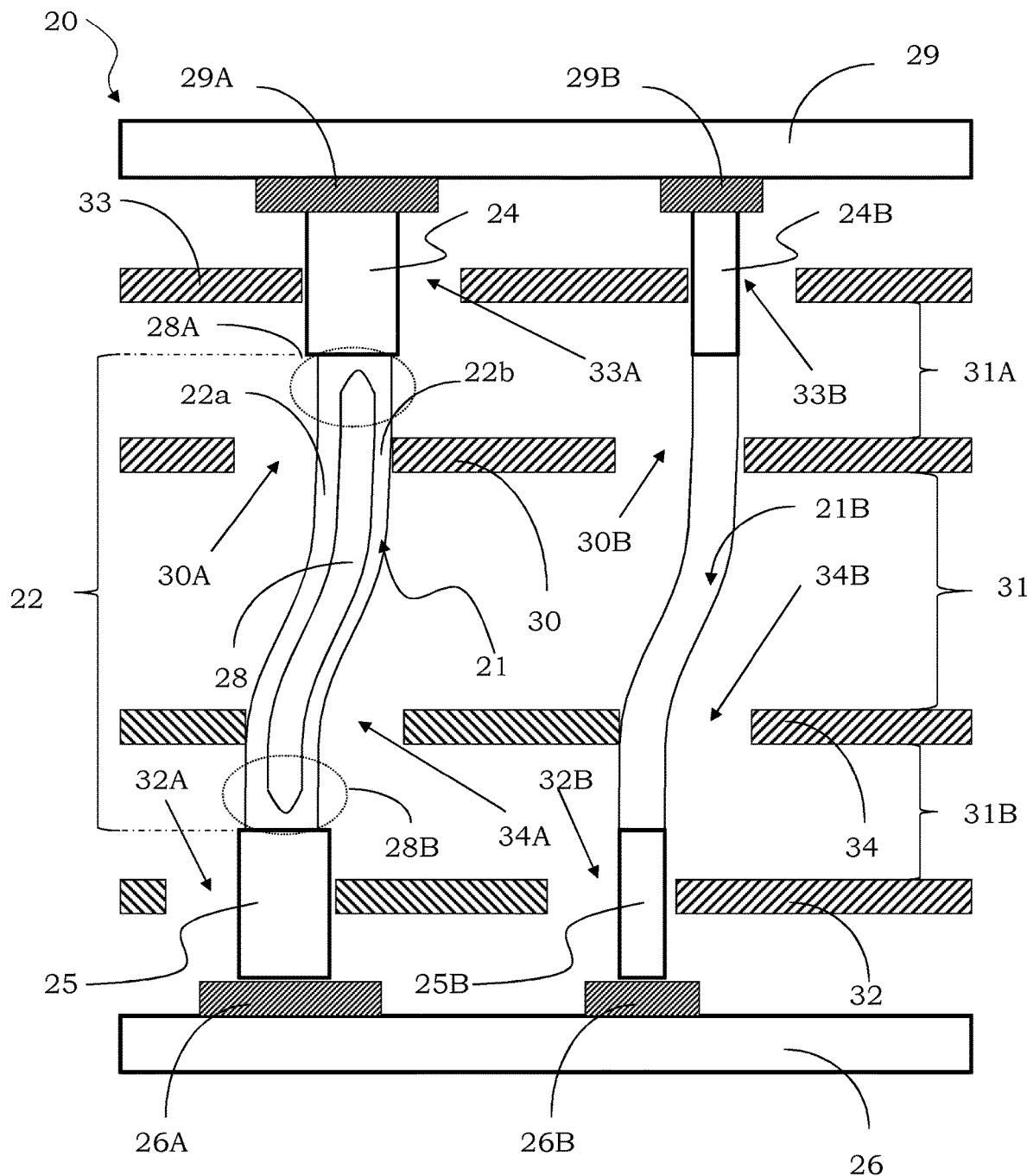

One particularly advantageous embodiment of the testing head 20 according to the present disclosure is schematically shown in FIG. 6.

The testing head 20 namely includes a plurality of contact probes 21 provided with openings 28 and being realized as described above together with a plurality of contact probes, shown with 21B, being realized in a traditional way and therefore not provided with any longitudinal opening.

In the example shown in the figure, the testing head 20 is of the shifted plates type and therefore includes the lower guide 32 and the upper guide 33, being flat and parallel to each other and provided with further respective guide holes, 32B and 33B, inside which the contact probes 21B without openings are slidingly housed.

More particularly, each contact probe 21B without opening includes a contact head 24B suitable to abut onto further contact pads 29B of the space transformer 29, as well as a contact tip 25B suitable to abut onto further contact pads 26B of the device under test 26.

Again, in the example given by way of illustration in the figure, the testing head 20 also includes at least one auxiliary guide 30 and one further auxiliary guide 34, as previously described, being provided with suitable further guide holes 30B and 34B to house the contact probes 21B without openings.

It should be underlined that the contact probes 21 and 21B of the testing head 20 shown in FIG. 6 substantially have the same length. However, the contact probes 21B without openings have a probe diameter less than the corresponding probe diameter of the contact probes 21 provided with the openings 28. Therefore, the probes realized in that way have a suitable elasticity to ensure a proper operation and enough useful life to the testing head 20 including them.

It should be underlined that therefore it is possible, using the same testing head 20 being realized as shown in FIG. 6, to test integrated devices having regions with a different pitch.

Actually, it is known that the most recent development of the technology used to realize integrated circuits allowed realizing devices with bidimensional arrays of contact pads having different relative distances or pitches in different regions of the device itself. More particularly, those regions having a different pitch also include contact pads having different dimensions, dedicated to handle different signals.

More particularly such a device includes a first region, called power region, where the contact pads have greater transversal dimension and distance between the corresponding centers with respect to a second region, called signal region, where the pads are smaller and closer to each other. In that case, they are referred to as multi-pitch devices.

Generally, in the first power region there are handled supply signals having high current values, in the range of 1 A, while in the second signal region there are handled input/output signals having lower current values, particularly in the range of 0.5 A.

Conveniently, the testing head 20 according to the present disclosure as shown in FIG. 6 allows carrying out the testing of those devices, particularly using the contact probes 21 provided with the openings 28 in the first power region and the contact probes 21B without openings in the second signal region, all the probes having the same length. In that way, the testing of multi-pitch devices is carried out.

In conclusion, the testing heads being realized according to the present disclosure demonstrated to have operating proprieties that are particularly performing and suitable to their use in high frequency applications, particularly at frequencies higher than 1000 MHz, thanks to the reduced dimensions of the bodies of the probes being included therein, whose length are less than 5000 μm.

Particularly, the presence of a cut-shaped opening in the body of the contact probes allows reducing the stiffness of those probes, drastically reducing the likelihood of breaking the probes themselves and guaranteeing at the same time a proper reduction of the pressure being exerted by the corresponding contact tips, avoiding any breaking of the contact pad of the devices under test.

Conveniently, the combined use of that opening and at least one auxiliary guide suitable to define a zone with low or very low stresses of the body of the probes, being suitably placed in order to include one or more critical portions of that body, intended as the zones that are more prone to breakings, due to the presence of the opening, allows obtaining a testing head with a proper useful life.

Moreover, the presence of at least two guides including proper guide holes for the sliding of the contact probes, allows enhancing that sliding and guaranteeing the absence of undesired blockages of the probes.

It should be underlined that the reduction of the friction forces inside the testing head translates in an enhanced operation of the same, as well as in an extended life of the individual components, with a consequent cost saving.

Furthermore, the presence of at least one stopper guarantees the proper operation of the testing head, particularly the placement and the proper holding of the contact probes being included therein.

More particularly, the stopper is able to prevent undesired movements of the contact probes on the occasion of cleaning operations of the testing head, which usually are carried out by means of powerful air jets, in particular being able to move the contact probes and to keep the contact probes inside the testing head also on the occasion of the space transformer removal, the counter-force being realized by the abutment of the stopper onto a corresponding undercut wall of the guide of the upper support guaranteeing to break any oxide that hold the contact heads to the pads of the space transformer itself.

Again, it should be underlined that, during the normal operation of the testing head, the stopper is not contacting the guides, and therefore it does not interfere with the movement of the corresponding contact probe 21. Conveniently, the stopper only acts in case of an undesired movement attempt of the contact probe towards the space transformer.

Particularly, the stopper is placed in order to prevent the contact tip of the contact probe from being able to come out from the lower guide, namely from the corresponding guide hole, which would make the testing head quite unusable, particularly in case of the buckling beams technology.

Moreover, it should be noted the advantage due to the fact that the contact probes are manufactured easily and at low costs, with the respective stopping means or stoppers being integrally manufactured directly from mold by means of conventional photolithographic technologies, or by means of MEMS (Micro Electro-Mechanical System) technologies, or moreover with a laser technology.

Conveniently, according to a further alternative embodiment, the testing head according to the present disclosure allows performing the testing of multi-pitch devices, particularly by using contact probes provided with openings in a first power region, where there are contact pads having greater dimensions and pitch, and contact probes without openings in a second signal region of the device, where there are contact pads having smaller dimensions and pitch, all the probes having the same length.

The considerations above hold also for different embodiments not explained herein but being however an object of the present disclosure, such as, for example, a testing head having many openings and only one auxiliary guide or having stoppers being arranged near the lower guide or also an overall greater number of guides. Moreover, the expedients implemented relative to one embodiment are also usable for other embodiments and are freely combinable with each other, also in a number greater than two.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head for functionality testing a device under test comprising:
a plurality of contact probes, each contact probe having:
first and second ends, the first end being a contact head of the contact probe and the second end being a contact tip of the contact probe and configured to abut onto a contact pad of the device under test, and
a body having a rod-like shape and a preset length less than 5000 µm and extending between the first and second ends and comprising a plurality of arms and an opening extending throughout the length of the body, the arms being parallel to each other, separated by the opening and connected to the first and second ends of the contact probe,
a first auxiliary guide, arranged transversely to each body,
a plurality of guide holes realized in the first auxiliary guide, the contact probes sliding through the guide holes,
a first gap defined by the first auxiliary guide and including an end of each opening, which is a critical portion of the body of each contact probe and is a zone more prone to breakings in the body, the critical portion being positioned in the first gap and undergoing low or even no bending stresses with respect to the rest of the body of each contact probe, and
a lower guide and an upper guide, the lower and upper guides being flat and parallel to each other and comprising respective pluralities of guide holes, each contact probe being housed inside respective guide holes of the lower and upper guides and having the contact head abutting onto a contact pad of a space transformer coupled to the testing head, wherein:
the first gap is defined between the first auxiliary guide and upper or lower guide, and
an end of the opening is included in the first gap.

2. The testing head of claim 1, wherein:
the first gap is defined between the first auxiliary guide and the upper guide, and
a second gap is defined between the first auxiliary guide and the lower guide.

3. The testing head of claim 2, wherein:
the first gap has a length between 100 µm and 500 µm, and
the second gap has a length between 1000 µm and 4000 µm.

4. The testing head of claim 1, comprising a second auxiliary guide, wherein:
the second auxiliary guide is arranged along the body of the contact probes, in parallel to the planes of the lower guide, upper guide and first auxiliary guide and comprising suitable guide holes through which the contact probes slide, respectively,
the second auxiliary guide is disposed between the first auxiliary guide and the lower guide or the upper guide respectively,
a second gap is defined between the first auxiliary guide and the second auxiliary guide, the second gap not comprising the critical portions of the body of the contact probes, and
a third gap is defined between the second auxiliary guide and the lower guide or the upper guide respectively, the third gap including a further end of the at least one opening, the further end being a further critical portion of the body of the contact probes.

5. The testing head of claim 4, wherein:
the first gap has a length between 100 µm and 500 µm,
the second gap has a length between 1000 µm and 4000 µm, and
the third gap has a length between 100 µm and 500 µm.

6. The testing head of claim 1, wherein each contact probe comprises a plurality of openings realized in the body of the contact probe, all along the length of the body of the contact probe and being parallel to each other, defining the plurality of arms of the body of the contact probe.

7. The testing head of claim 1, wherein each contact probe further comprises material bridges arranged inside the opening, the material bridges connecting the arms defined in the body to each other and acting as strengthening elements.

8. The testing head of claim 7, wherein the material bridges are arranged inside the first gap.

9. The testing head of claim 1, wherein each contact probe comprises a lateral wall with a protruding element or stopper, the stopper being realized in correspondence of one wall of a guide hole of a guide above the stopper and contacting the lateral wall of the contact probe.

10. A testing head for functionality testing a device under test comprising:
a plurality of contact probes, each contact probe having:
first and second ends, the first end being a contact head of the contact probe and the second end being a contact tip of the contact probe and configured to abut onto a contact pad of the device under test, and
a body having a rod-like shape and a preset length less than 5000 µm and extending between the first and second ends and comprising a plurality of arms and an opening extending throughout the length of the body, the arms being parallel to each other, separated by the opening and connected to the first and second ends of the contact probe,
a first auxiliary guide, arranged transversely to each body,
a plurality of guide holes realized in the first auxiliary guide, the contact probes sliding through the guide holes, and
a first gap defined by the first auxiliary guide and including an end of each opening, which is a critical portion of the body of each contact probe and is a zone more prone to breakings in the body, the critical portion being positioned in the first gap and undergoing low or even no bending stresses with respect to the rest of the body of each contact probe, wherein at least some of the contact probes are configured to abut onto first contact pads of a power region of the device under test, the testing head further comprising contact probes without openings that are configured to abut onto second contact pads of a signal region of the device under test, the first contact pads having greater dimensions and pitch than the second contact pads.

11. The testing head of claim 10, wherein the contact probes without openings have a probe diameter smaller than a probe diameter of the contact probes with openings.

12. The testing head of claim 10, wherein the contact probes with openings carry first signals and the contact probes without openings carry second signals,
the first signals being supply signals having higher current values than the second signals being input/output signals.

13. The testing head of claim 10, wherein the contact probes with openings and the contact probes without openings have a same length.

14. A testing head for functionality testing a device under test comprising:
- a plurality of contact probes, each contact probe having:
  - first and second ends, the first end being a contact head of the contact probes and the second end being a contact tip of the contact probes and configured to abut onto a contact pad of the device under test, and
  - a body having a rod-like shape and a preset length less than 5000 μm and extending between the first and second ends and comprising a plurality of arms and an opening extending throughout the length of the body, the arms being parallel to each other, separated by the opening and connected to the first and second ends of the contact probe,
- a support to which the first end is fixedly coupled,
- a first auxiliary guide, arranged transversely to each body,
- a plurality of guide holes realized in the first auxiliary guide, the contact probes sliding through the guide holes, and
- a first gap defined between the first auxiliary guide and the support and including a critical portion of the body of each contact probe located at a junction between the arms, the critical portion of each body of the contact probes being a zone more prone to breakings in the body and being positioned in the first gap and undergoing low or even no bending stresses with respect to the rest of the body of each contact probe, wherein at least some of the contact probes are configured to abut onto first contact pads of a power region of the device under test, the testing head further comprising contact probes without openings that are configured to abut onto second contact pads of a signal region of the device under test, the first contact pads having greater dimensions and pitch than the second contact pads.

15. The testing head of claim 14, wherein each contact probe comprises a plurality of openings realized in the body of the contact probe, all along the length of the body of the contact probe and being parallel to each other, defining the plurality of arms of the body of the contact probe.

16. The testing head of claim 14, wherein each contact probe further comprises material bridges arranged inside the opening to connect the arms so defined in the body to each other, the material bridges acting as strengthening elements.

17. The testing head of claim 14, wherein each contact probe comprises a protruding element or stopper originating from one of its lateral walls, the stopper being realized in correspondence of one wall of a guide hole of the first auxiliary guide above the same and contacting the lateral wall of the contact probe.

18. The testing head of claim 14, wherein the contact probes with openings carry first signals and the contact probes without openings carry second signals, the first signals being supply signals having higher current values than the second signals being input/output signals.

19. A testing head for functionality testing a device under test comprising:
- a plurality of contact probes, each contact probe having:
  - first and second ends, the first end being a contact head of the contact probes and the second end being a contact tip of the contact probes and configured to abut onto a contact pad of the device under test, and
  - a body having a rod-like shape and a preset length being less than 5000 μm and extending between the first and second ends and comprising a plurality of arms and an opening extending throughout the length of the body, the arms being parallel to each other, separated by the opening and connected to the first and second ends of the contact probe,
- a lower guide and an upper guide being flat and parallel to each other and comprising respective guide holes inside which one respective contact probe is housed,
- a first auxiliary guide, arranged transversely to each body,
- a plurality of guide holes realized in the first auxiliary guide, the contact probes sliding through the guide holes, and
- a first gap defined between the first auxiliary guide and the lower guide when the first auxiliary guide is near the first end or the upper guide when the first auxiliary guide is near the second end, wherein:
  - the first gap includes a critical portion of the body of each contact probe located at a junction between the arms of the body, and
  - the critical portion of the body of each contact probe is a zone more prone to breakings in the body and being positioned in the first gap and undergoing low or even no bending stresses with respect to the rest of the body.

20. The testing head of claim 19, comprising a second auxiliary guide, wherein:
- the first and second auxiliary guides is arranged along the bodies of the contact probes, in parallel to the planes of the lower and upper guides,
- the first gap is defined between the first auxiliary guide and the upper guide,
- a second gap is defined between the second auxiliary guide and the lower guide,
- the first gap including a first critical portion of the body of each contact probe and the second gap including a second critical portion of the body of the contact probe, and
- a third gap being defined between the first auxiliary guide and the second auxiliary guide and not comprising the critical portions of the body of the contact probe.

21. The testing head of claim 20, wherein the first and second gaps have a length between 100 μm and 500 μm and the third gap has a length between 1000 μm and 4000 μm.

22. The testing head of claim 19, wherein each contact probe comprises a plurality of openings realized in the body, all along the length of the body and being parallel to each other, defining the plurality of arms.

23. The testing head of claim 19, wherein each contact probe further comprises material bridges arranged inside the openings and connecting the arms so defined in the body to each other, the material bridges acting as strengthening elements.

24. The testing head of claim 19, wherein each contact probe comprises a protruding element or stopper originating from a lateral wall of the contact probe, the stopper being realized in correspondence of one wall of a guide hole of a guide above the stopper and contacting the lateral wall of the contact probe.

25. The testing head of claim 19, wherein at least some of the contact probes are configured to abut onto first contact pads of a power region of the device under test, the testing head further comprising contact probes without openings that are configured to abut onto second contact pads of a signal region of the device under test, the first contact pads having greater dimensions and pitch than the second contact pads and the contact probes without openings have a probe diameter smaller than a probe diameter of the contact probes with openings.

26. A testing head for functionality testing a device under test comprising:

a plurality of first contact probes, each first contact probe having:
  first and second ends, the first end being a contact head of the contact probe and the second end being a contact tip of the contact probe and configured to abut onto a contact pad of the device under test, and
  a body having a rod-like shape and a preset length being less than 5000 µm and extending between the first and second ends and comprising a plurality of arms and an opening extending throughout a length of the body, the arms being parallel to each other, separated by the opening and connected to the first and second ends of the contact probe,
a plurality of second contact probes each without an opening,
a first auxiliary guide, arranged transversely to each body,
a plurality of guide holes realized in the first auxiliary guide, the first and second contact probes sliding through them, and
a first gap defined by the first auxiliary guide and including an end of the opening, which is a critical portion of the body of each first contact probe and is a zone more prone to breakings in the body, wherein:
  the critical portion is positioned in the first gap and undergoing low or even no bending stresses with respect to the rest of the body of each first contact probe,
  the first contact probes are configured to abut onto first contact pads of the device under test and the second contact probes are configured to abut onto second contact pads of the device under test.

27. The testing head of claim 26, wherein the first contact pads are in a power region of the device under test and the second contact pads are in a signal region of the device under test, the first contact pads having greater dimensions and pitch than the second contact pads.

28. The testing head of claim 27, wherein the first contact probes have a probe diameter smaller than a probe diameter of the second contact probes.

29. The testing head of claim 26, further comprising a support, the second contact probes having respective contact heads and the contact heads of the first and second contact probes being fixedly coupled to the support at respective contact areas, wherein
  the first gap is defined between the first auxiliary guide and the support, and
  a second gap is defined between the first auxiliary guide and the contact tips.

30. The testing head of claim 26, further comprising a lower guide and an upper guide, the lower and upper guides being flat and parallel to each other and comprising respective pluralities of guide holes, wherein:
  each second contact probe has a body, a contact tip, and a contact head,
  each of the first and second contact probes is housed inside a respective guide hole and having the contact head abutting onto a contact pad of a space transformer coupled to the testing head,
  the first gap is defined between the first auxiliary guide and upper or lower guide, and
  an end of each opening is included in the first gap.

31. The testing head of claim 30, comprising a second auxiliary guide, wherein:
  the second auxiliary guide is arranged along the bodies of the contact probes, in parallel to planes of the lower guide, upper guide and first auxiliary guide and comprising suitable guide holes through which the first and second contact probes respectively slide,
  the second auxiliary guide is disposed between the first auxiliary guide and the lower guide or the upper guide respectively,
  a second gap is defined between the first auxiliary guide and the second auxiliary guide, the second gap not comprising the critical portions of the bodies of the first contact probes, and
  a third gap is defined between the second auxiliary guide and the lower guide or the upper guide respectively, the third gap including a further end of the opening of each first contact probe, the further end being a further critical portion of the body of each first contact probe.

32. The testing head of claim 26, wherein each first contact probe comprises a plurality of openings realized in the body of the first contact probe, all along the length of the body and being parallel to each other, defining the plurality of arms.

33. The testing head of claim 26, wherein each first contact probe further comprises material bridges arranged inside the opening, the material bridges connecting the arms defined in the body to each other and acting as strengthening elements.

34. The testing head of claim 33, wherein the material bridges are arranged inside the first gap or inside a second gap defined between the first auxiliary guide and the tips of the first contact probes.

35. The testing head of claim 26, wherein each contact probe comprises at a protruding element or stopper originating from a lateral wall of the contact probe, the stopper being realized in correspondence of one wall of a guide hole of a guide above the stopper and contacting the lateral wall of the contact probe.

* * * * *